(12) United States Patent
Jakes et al.

(10) Patent No.: US 11,791,910 B2
(45) Date of Patent: Oct. 17, 2023

(54) SYSTEM AND METHOD FOR ELECTRONIC DEVICE FAULT DIAGNOSES

(71) Applicant: Lenovo (Singapore) Pte. Ltd., New Tech Park (SG)

(72) Inventors: Philip J. Jakes, Durham, NC (US); James C. Salembier, Cary, NC (US)

(73) Assignee: Lenovo (Singapore) Pte. Ltd., New Tech Park (SG)

( * ) Notice: Subject to any disclaimer, the term of this patent is extended or adjusted under 35 U.S.C. 154(b) by 85 days.

(21) Appl. No.: 17/355,304

(22) Filed: Jun. 23, 2021

(65) Prior Publication Data

US 2022/0416913 A1   Dec. 29, 2022

(51) Int. Cl.
*H04B 17/15*    (2015.01)
*H04B 17/29*    (2015.01)
*G08B 5/22*     (2006.01)
*G01R 29/08*    (2006.01)
*H04B 17/318*   (2015.01)
*H04B 17/23*    (2015.01)

(52) U.S. Cl.
CPC ......... *H04B 17/15* (2015.01); *G01R 29/0871* (2013.01); *G01R 29/0892* (2013.01); *G08B 5/22* (2013.01); *H04B 17/23* (2015.01); *H04B 17/29* (2015.01); *H04B 17/318* (2015.01)

(58) Field of Classification Search
CPC .................................................... H04B 17/15
See application file for complete search history.

(56) References Cited

U.S. PATENT DOCUMENTS

| | | | | |
|---|---|---|---|---|
| 2008/0101272 A1* | 5/2008 | Hayes | .................. | G06F 13/385 370/313 |
| 2012/0169537 A1* | 7/2012 | Danilenko | .............. | G01S 19/36 342/386 |
| 2018/0376423 A1* | 12/2018 | Atefi | ................. | H04W 52/0229 |

\* cited by examiner

*Primary Examiner* — Hsinchun Liao
(74) *Attorney, Agent, or Firm* — THE SMALL PATENT LAW GROUP LLC; Dean D. Small (57) ABSTRACT

An electronic device is provided that includes a substrate for receiving communication circuitry, and an antenna coupled to the substrate and configured to provide a signal to the communication circuitry. The electronic device also includes one or more processors, and a data storage device having executable instructions accessible by the one or more processors. Responsive to execution of the instructions, the one or more processors are configured to monitor the antenna or the communication circuitry to detect the signal, and prompt a communication related to the antenna in response to not detecting the signal or detecting a degraded signal.

18 Claims, 4 Drawing Sheets

SYSTEM AND METHOD FOR ELECTRONIC DEVICE FAULT DIAGNOSES

BACKGROUND

Embodiments of the present disclosure generally relate to systems and methods for diagnosing an electronic device fault, and more particularly to faults associated with antenna cables and remedial actions to address the fault.

Personal computers (PCs) have become fundamental tools both in personal life and business. The PC offers a relatively large user interface with a keyboard and a separate display that facilitates extended, continuous use. For example, a user may interact with the PC using the keyboard, a mouse, and/or another user-input device, and the user may receive visual content from the PC via the display.

Many PCs include a wireless card that permits wireless communication through networks such as wide area networks (WANs) and shorter range protocols such as Bluetooth (BT), Wi-Fi, etc. As technologies advance, the number of antenna connections in mobile systems is increasing as the number of wireless devices similarly increases. Specifically, unlike in many tablets and phones, the modular nature of PCs means that most antenna signals are run via coax cables and small connectors. With 2×2 Wi-Fi/BT, 4×4 WAN, and additional high frequency 5G signals, many systems include six to nine (6-9) different antenna cables attached to various wireless cards. When one of those connections fails, wireless performance suffers dramatically, but does not necessary stop. This causes customer frustration. Specifically, the customer does not understand why some wireless communication is working, why wireless communication has become weaker, etc. There is also not an understanding whether the problem is with the network, a router, the location of an electronic device, or the electronic device itself. This leads to either time consuming trouble shooting by the user such as restarting the electronic device, restarting a router, moving locations, or to dealing with the effects of the poor communication.

Currently, during manufacturing inspections are made to ensure that connections between the multiple antenna and wireless card are provided. Still, often during shipping, use, etc. an antenna that was properly connected at the time of manufacturing becomes disconnected. Whether as a result of the electronic device being dropped, bumped, moved, expose to undesirable whether conditions, or the like, disconnection simply occurs after the electronic device is manufactured, resulting in a frustrated customer.

SUMMARY

In accordance with embodiments herein, an electronic device is provided that includes a substrate for receiving communication circuitry, and an antenna coupled to the substrate and configured to provide a signal to the communication circuitry. The electronic device also includes one or more processors, and a data storage device having executable instructions accessible by the one or more processors. Responsive to execution of the instructions, the one or more processors are configured to monitor the antenna or the communication circuitry to detect the signal, and prompt a communication related to the antenna in response to not detecting the signal or detecting a degraded signal.

Optionally, the one or more processors are further configured to diagnose an antenna disconnection based on not detecting the signal or detecting the degraded signal. In one aspect, the one or more processors are further configured to diagnose the degraded signal by comparing the signal to another signal. In another aspect, the signal is a degraded signal when the signal has a strength that is less than a threshold percentage of the another signal. In one example, the threshold percentage varies based on the location of the electronic device or duration of time of monitoring the signal.

Optionally, the one or more processors are further configured to determine a remedial action in response to diagnosing an antenna disconnection or the degraded signal, and include the remedial action in the communication related to the antenna disconnection or the degraded signal. In one aspect, the remedial action is one of instructions for repairing the antenna disconnection or the degraded signal, or contact information for repairing the antenna disconnection or the degraded signal. In one example, the substrate is a wireless card. In another aspect, the electronic device also includes a display coupled to the one or more processors, and the one or more processors are also configured to display the communication related to the antenna disconnection or degraded signal. In another example, the electronic device also includes an indicator light coupled to the one or more processors, and to prompt the communication related to the antenna disconnection or the degraded signal the one or more processors are configured to actuate the indicator light.

In accordance with embodiments herein an electronic device is provided that includes a first wireless card for receiving communication circuitry, a first antenna coupled to the first wireless card and configured to provide a first signal to the wireless card, and a second antenna coupled to the first wireless card and configured to provide a second signal to the first wireless card. The electronic device also includes one or more processors, and a data storage device having executable instructions accessible by the one or more processors. Responsive to execution of the instructions, the one or more processors are configured to monitor the first antenna, and second antenna to detect the first signal, and second signal, and diagnose a first antenna disconnection from the first wireless card, or a first antenna degraded signal.

Optionally, the one or more processors are further configured to diagnose a second antenna disconnection from the first wireless card, or second antenna degraded signal. In one aspect, to diagnose the first antenna disconnection from the wireless card, or the first antenna degraded signal, the first signal is compared to the second signal. In another aspect, the one or more processors are further configured to determine a remedial action in response to diagnosing the first antenna disconnection, or first antenna degraded signal, and communicate the remedial action to a user of the electronic device.

In accordance with embodiments herein a computer implemented method is provided that under control of one or more processors including program instructions monitors a first signal communicated between a first antenna and a wireless card, and monitors a second signal communicated between a second antenna and a wireless card. The method also includes diagnosing a first antenna disconnection or a first antenna degraded signal based on a comparison of the first signal to the second signal, and prompting a communication related to the first antenna disconnection or the first antenna degraded signal.

Optionally, the method also includes determining a remedial action in response to diagnosing the first antenna disconnection or the first antenna degraded signal. In one aspect, the method also includes implementing the remedial action in response to determining the remedial action. In another aspect, the method also includes including the remedial action in the communication related to the first antenna or the second antenna. In one example, the remedial action is one of instructions for repairing the first antenna disconnection or first antenna degraded signal, or contact information for repairing the first antenna disconnection or first antenna degraded signal. In another example, to diagnose the first antenna degraded signal a first antenna signal strength is compared to a second antenna signal strength and a strength threshold is exceeded.

DETAILED DESCRIPTION

It will be readily understood that the components of the embodiments as generally described and illustrated in the figures herein, may be arranged and designed in a wide variety of different configurations in addition to the described example embodiments. Thus, the following more detailed description of the example embodiments, as represented in the figures, is not intended to limit the scope of the embodiments as claimed, but is merely representative of example embodiments.

Reference throughout this specification to "one embodiment" or "an embodiment" (or the like) means that a particular feature, structure, or characteristic described in connection with the embodiment is included in at least one embodiment. Thus, appearances of the phrases "in one embodiment," "in an embodiment" or the like in various places throughout this specification are not necessarily all referring to the same embodiment.

Furthermore, the described features, structures or characteristics may be combined in any suitable manner in one or more embodiments. In the following description, numerous specific details are provided to give a thorough understanding of the various embodiments. One skilled in the relevant art will recognize, however, that the various embodiments can be practiced without one or more of the specific details, or with other methods, components, materials, etc. In other instances, well-known structures, materials, or operations are not shown or described in detail to avoid obfuscation. The following description is intended only by way of example, and simply illustrates certain example embodiments.

The term "prompt" refers to any communication by an electronic device intended to cause an action by a user or third party, including remedial actions. The prompt may be written text in a pop-up, written text in an electronic mail, written text in a text message, voice command, sound, light indicator, etc. that provides information to a user or third party to take action. While a prompt may include specific words, phases, or numbers, the prompt does not have to include specific words, phrases, or numbers. Instead, as an example, the prompt can be a sound such as a "ping" or "bing", the turning on an off of an indicator light, or the like. In particular, the prompt simply provides information to a user or third party, such as information related to remedial actions that may be undertaken to address a diagnosed operating condition fault.

The terms "diagnose", "diagnosing", "diagnosis", etc. refer to the action of determining why a component is not operating for its intended purpose. As an example, an antenna is not operating for its intended purpose when no signal is detected, a degraded signal is detected, or the like. Such diagnosis may be made based on operating conditions related to the component. For example, in conjunction with an antenna that is mechanically coupled to a substrate, such as a wireless card, the intended purpose of the antenna, mechanical coupling, and wireless card is to provide a communication path for a communication signal from the antenna to the wireless card. When such an antenna is disconnected from the wireless card, and no signal can be obtained between the antenna and wireless card, a disconnected antenna or malfunctioning antenna diagnosis can be determined. Alternatively, a poor connection, damaged cable, etc. can cause no signal, or a degraded signal to a occur, also resulting in a diagnosis of a malfunctioning antenna or disconnected antenna. A diagnosis does not have to be correct. In other words, another reason for no signal, or a degraded signal being between the antenna and wireless card may be presented; however, because a large majority of the time when a degraded signal or no signal is being communicated between the antenna and wireless card a malfunctioning antenna or bad connection is provided, the diagnosis is that a malfunctioning antenna or bad connection is provided.

The term "degraded signal" refers to a signal that is received, but has at least one characteristic, such as signal strength, that is less than a threshold than if an antenna were operating optimally. The threshold may be expressed as a threshold percentage, or based on a measurable characteristic. The threshold is provided because factors such as location, interference, or the like may cause minimal reductions and variances that are not caused by a malfunctioning hardware of an antenna. Such threshold can be based on a comparison of two signals that are expected to provide similar characteristics. In one example, a first signal may be received by a first antenna connected to a wireless card, and a second signal from the same source may also be received by a second antenna connected to the wireless card. As such, the signal strength of the first and second signals is expected to be similar. When the first signal strength is compared to a second signal strength a determination may be made if a strength threshold is exceeded. For example, the strength threshold may be 50% or less strength of the first signal compared to the second signal such that if the first signal strength is 50% weaker than the second signal strength, the threshold is considered exceeded causing a diagnoses of a degraded signal. The threshold may be determined and varied based on the environment of an electronic device, location of an electronic device, movement of an electronic device, whether in the environment of the electronic device, or the like. Such determinations may be made by an algorithm, an artificial intelligence based algorithm, mathematical model, mathematical function, lookup table, decision tree or the like.

The term "remedial action" is any and all actions that may be undertaken to correct, repair, fix, remedy, etc. a diagnosed faulty operating condition. The remedial action may include providing instructions, including through a prompt, related how to correct, repair, fix, remedy, etc. the diagnosed faulty operating condition, the implementation of a correction, repair, fix, remedy, etc., communicating, including through a prompt, contact information of an individual or company that may correct, repair, fix, remedy, etc. the faulty operating condition, contacting an individual or company that may correct, repair, fix, remedy, etc. the faulty operating condition, or the like.

The term "obtains" and "obtaining", as used in connection with data, signals, information, and the like, include at least one of i) accessing memory of an external device or remote server where the data, signals, information, etc. are stored, ii) receiving the data, signals, information, etc. over a wireless communications link between the base device and a secondary device, and/or iii) receiving the data, signals, information, etc. at a remote server over a network connection. The obtaining operation, when from the perspective of a base device, may include sensing new signals in real time, and/or accessing memory to read stored data, signals, information, etc. from memory within the base device. The obtaining operation, when from the perspective of a secondary device, includes receiving the data, signals, information, etc. at a transceiver of the secondary device where the data, signals, information, etc. are transmitted from a base device and/or a remote server. The obtaining operation may be from the perspective of a remote server, such as when receiving the data, signals, information, etc. at a network interface from a local external device and/or directly from a base device. The remote server may also obtain the data, signals, information, etc. from local memory and/or from other memory, such as within a cloud storage environment and/or from the memory of a personal computer.

It should be clearly understood that the various arrangements and processes broadly described and illustrated with respect to the Figures, and/or one or more individual components or elements of such arrangements and/or one or more process operations associated of such processes, can be employed independently from or together with one or more other components, elements and/or process operations described and illustrated herein. Accordingly, while various arrangements and processes are broadly contemplated, described and illustrated herein, it should be understood that they are provided merely in illustrative and non-restrictive fashion, and furthermore can be regarded as but mere examples of possible working environments in which one or more arrangements or processes may function or operate.

An electronic device such as a PC is provided that has one or more processors that monitor signal received by and transmitted by communication circuitry via individual antenna coupled to a wireless card within the electronic device. In this manner, the one or more processors monitor the multiple connections between the wireless card and individual antennas, and determines whether an antenna is likely disconnected. In particular, when two or more antennas are connected to a remote wireless device, both antenna should be receiving a signal, even if one is substantially better than the other. If there is a signal appearing via one antenna connector and no signal, or degraded signal on the other, it is likely that the antenna cable has been disrupted as a result of a bad connection between the antenna cable and the wireless card, a damaged antenna cable, etc. A prompt can then be provided to the user through diagnostics, via a pop-up/toast message, or the like to communicate the disruption to the user is the result of a disconnected or malfunctioning antenna.

Figure 1:
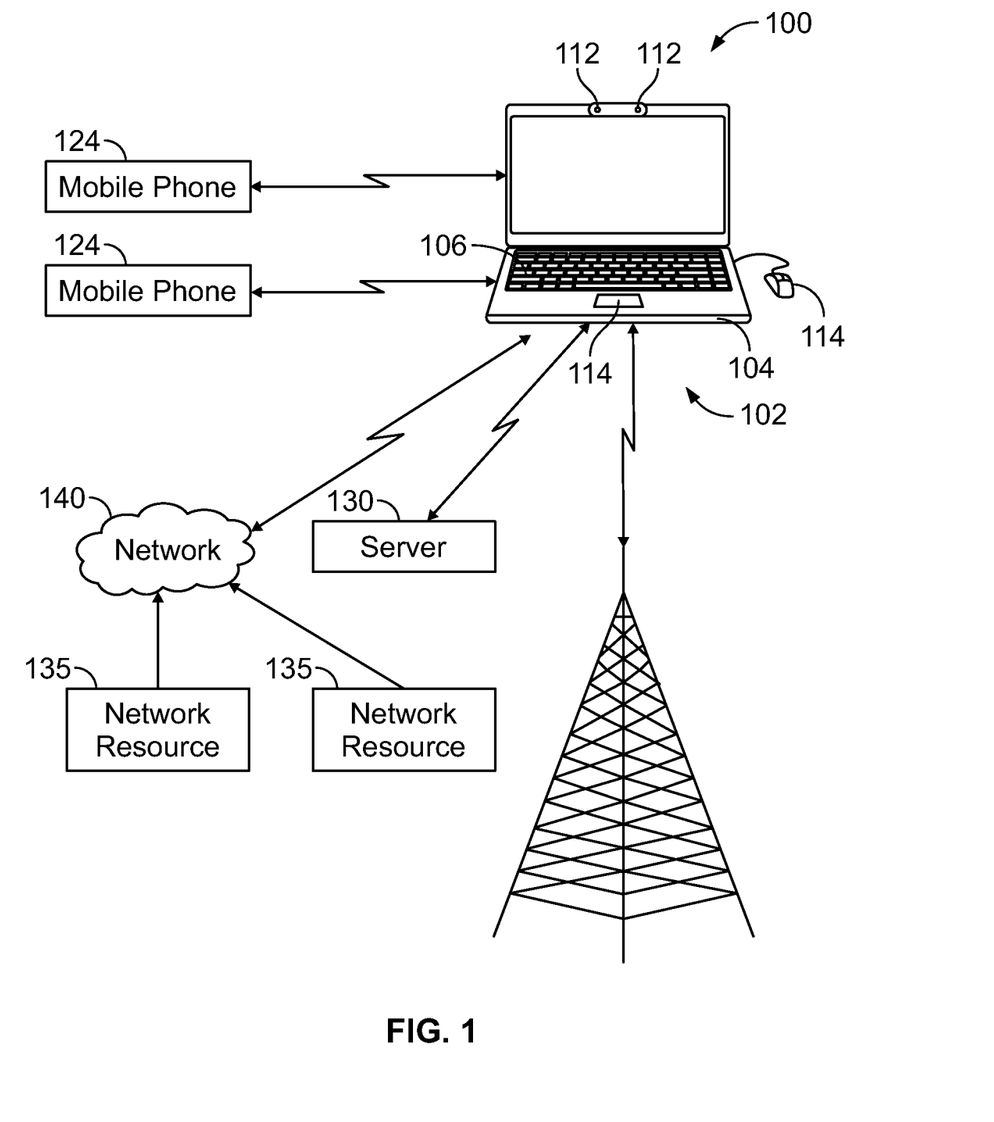
FIG. 1 illustrates a perspective view of an electronic device formed in accordance with an embodiment described herein.

FIG. 1 is a perspective view of an electronic device 100 formed according to one embodiment herein. The electronic device 100 can be a PC, laptop computer, iPad, Ipod, tablet, phones, game devices, electronic organizers, wearable electronic devices, and the like. The electronic device 100 includes a main body 102 that includes a housing 104. The housing 104 in the illustrated embodiment has a flat, box-shaped structure. The main body 102 includes at least one user-interface device. In the illustrated embodiment, the main body 102 includes a keyboard 106. The keyboard 106 includes multiple discrete depressible keys. In other embodiments, additional input devices can be provided, including a touchpad, mouse, portable drive coupled with a USB chord, etc. The electronic device 100 also includes a display 108. In one example, the display 108 is mechanically coupled to the main body 102. In one example, the display 108 is rotatably coupled to the main body 102 to rotate from an opened to closed position. Alternatively, the main body 102 and display 108 are not mechanically coupled to one another, and instead are in wireless communication with one another. The display 108 includes a screen 110 on which text, pictures, video, etc. may be displayed. The screen may include a liquid crystal display (LCD) screen, a plasma screen, a light emitting diode (LED) screen, an organic light emitting diode (OLED) screen, an electronic paper screen, or the like.

In one example embodiment, the one or more processors are coupled to a communication assembly (communication assembly 202 shown in FIG. 2, and communication assembly 300 shown in FIG. 3) that executes an application such that the one or more processors monitor signals received by communication circuitry from an antenna that provide wireless communication. In such an embodiment, the main body 102 or display 108 can include an indicator light 112. In one example, the indicator light 112 may be a light emitting diode that receives current when a signal is not detected from an antenna.

Figure 4:
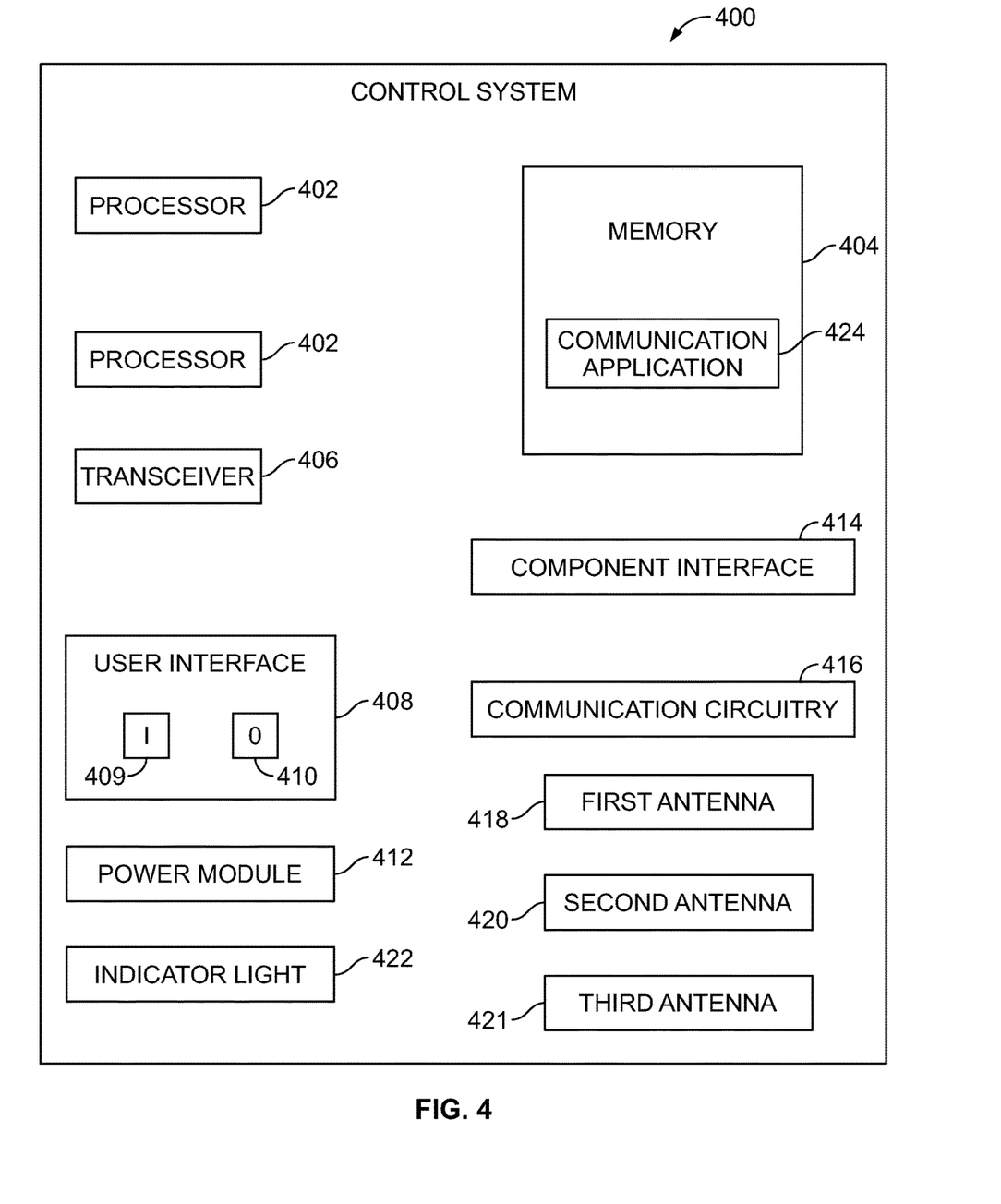
FIG. 4 illustrates a schematic block diagram of a control system for an electronic device in accordance with an embodiment described herein.

The electronic device 100 may also include a memory (e.g., the memory 404 shown in FIG. 4) and one or more processors (e.g., the processor 402 shown in FIG. 4). The memory stores program instructions for visually displaying and interacting with various programs (also referred to herein as applications). The one or more processors are configured to access the memory and execute the program instructions, such as responsive to user inputs entered via the keyboard 106 and/or other input devices 114. The other input devices 114 can include a mouse, touch pad, or the like. In one or more embodiments, the memory and the one or more processors are contained within the housing 104 of the main body 102. Alternatively, the memory and/or the one or more processors may be contained within the display 108 and operatively coupled to the main body 102 (and the keyboard and electronic devices thereof) via one or more cables extending between the main body 102 and display 108. In another alternative embodiment, the memory and/or the one or more processors may be contained in another housing that operatively couples to the main body 102 conductively via a cable or wirelessly via a wireless transceiver (e.g., the wireless transceiver 406 shown in FIG. 4) of the main body 102.

The electronic device 100 can also control communication of information, in accordance with embodiments herein. The electronic device 100 can communicate with one or more auxiliary electronic devices 124, and one or more servers 130. In one example, the one or more auxiliary electronic devices 124 include electronic devices related to the user, such as a smart phone, smart watch, iPad, iPod, tablet, smart device, etc. Alternatively, the one or more auxiliary electronic device is related to a third party, such as a repair shop, repairperson, manufacturer, etc.

As non-limiting examples, the electronic device 100 may access a network 140 through a wireless communications channel and/or through a network connection (e.g. the Internet). The wireless communication channel can include a wireless card (FIG. 2, 204, and FIG. 3, 300) that is within the electronic device 100. The electronic device 100 in one embodiment is in communication with a network resource 135 via the network. The network resource 135 can be a server, application, remote processor, the cloud, etc. In one example, the network resource 135 is one or more processors of an auxiliary electronic device 124 that communicates over the network 140 with the electronic device 100. The network 140 may represent one or more of a local area network (LAN), a wide area network (WAN), an Intranet or other private network that may not be accessible by the general public, or a global network, such as the Internet or other publicly accessible network.

Figure 2:
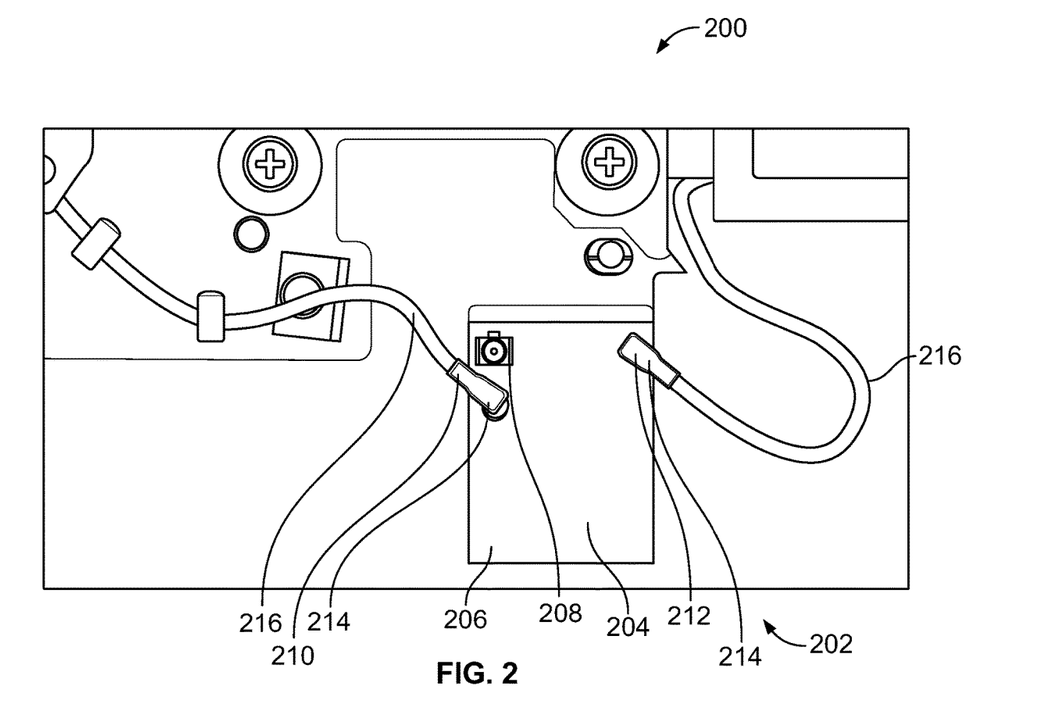
FIG. 2 illustrates a cut-away perspective view of an electronic device formed in accordance with an embodiment described herein.

FIG. 2 illustrates a cut-away perspective view of an electronic device 200 to show a communication assembly 202. In one example, the electronic device 200 is the electronic device 100 of FIG. 1. In an example, the communication assembly 202 may be located within a main body of the electronic device, or alternatively in the display of the electronic device.

The communication assembly 202 includes a wireless card 204 that has an outer shell 206 that protects communication circuitry disposed within the outer shell 206. The wireless card 204 includes inputs 208 where one or more antenna 210, 212 may be mechanically coupled to the wireless card 204. Each antenna includes an antenna connector 214 for coupling an antenna cable 216 to the wireless card 204. In example embodiments, the coupling may be provided through welding, soldering, press fit, threadable coupling, etc. to provide both a mechanical and electrical coupling between each antenna 210, 212 and the wireless card 204. In this manner, each antenna 210, 212 may provide a communication signal from exterior of the wireless card 204, to the wireless card. One or more processors may monitor to ensure that a first signal from the first antenna 210, and a second signal from a second antenna are being received by the wireless card.

When one of the first signal or second signal are not detected, or at least one is determined to be a degraded signal an indication is provided that a fault operating condition corresponding to a disconnected antenna, or degraded signal is presented. In one example, a degraded signal is determined by comparing the signal received to another signal received from the same source by a different antenna. In one example, the different antenna may be coupled to the same wireless card, whereas alternatively, the different antenna may be coupled to a different wireless card, but obtain a similar or overlapping frequency range as the antenna. In one example, the degraded signal is determined when a threshold, such as a strength threshold is exceeded. In particular, signal characteristics, such as first second strength and second signal strength may be compared to one another, and if not within a threshold percentage such as 80%, 75%, 70%, 60%, 50%, 40%, 30%, 20%, 10%, or the like a degraded signal is determined. Alternatively, a threshold characteristic such as decibel, decibel milliwatts, or the like may be utilized. Thus, when comparing the signals, if the strength of a first signal is less than or greater than a threshold value, such as 10% of the strength of the second signal, the first signal is considered a degraded signal. In yet another example, when comparing the first signal to the second signal, the threshold value may vary as a result of comparing average signals over a determined period of time. In other words, while when comparing a first signal to a second signal, the signal strength of the first signal needs to be less than 5% of the second signal to result in an antenna considered a degraded signal, additionally, or alternatively, an average signal strength of the first antenna signal over a period of a week being less than 20% of the average signal strength of the second antenna can also result in a degraded signal.

In yet another example, when comparing the first signal to the second signal, the threshold value may vary as a result of the location of the electronic device. Specifically, when the electronic device is portable, such as laptop computer, in certain locations signals may be stronger or weaker. For example, when a person is in their home, a strong signal may be provided, whereas when vacationing in mountain areas, or visiting relatives in a remote location, weaker signals are provided. Consequently, if the electronic device is in a determined area having a strong signal, a first signal being less than a threshold value of 20% of the strength of the second signal may be considered a degraded signal. Whereas, when the same electronic device is in an area that is not considered to have a strong signal, the first signal is considered degraded signal when the first signal has less than 10% of the strength of the second signal. The areas of strong signals may be determined by networks the electronic device is connected to, a manual placement by a user in a communication application that a strong or weak signal strength zone is provided, through utilization of global positioning data and information, through utilization of sensor data or information related to signals in the area, or the like. In each instance, not only are determinations made regarding whether no signal is presented, but also if a degraded signal is provided.

Figure 3:
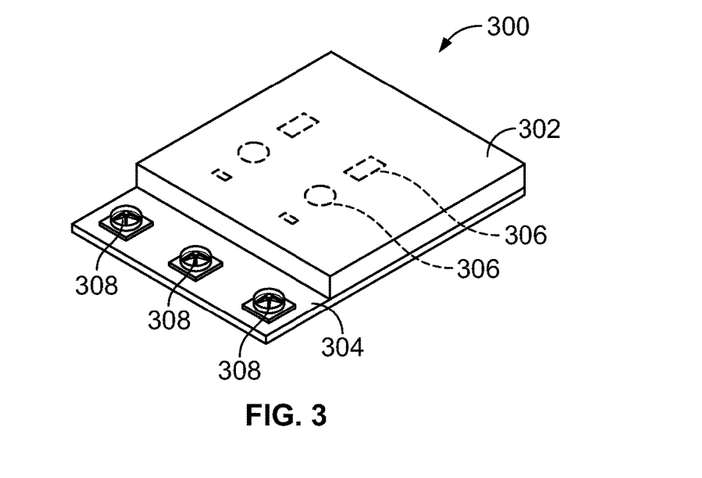
FIG. 3 illustrates a perspective view of a wireless card in accordance with an embodiment described herein.

FIG. 3 illustrates a cutaway view of an example wireless card 300 that may be part of a communication assembly. In one example, the wireless card 300 is the wireless card 204 of FIG. 2. The wireless card 300 includes an outer shell 302 that covers and protects a substrate 304 that includes communication circuitry 306. The substrate in one example may be a printed circuit board, silicon, or other material for receiving electronic components, traces, or the like. The communication circuitry may include transformers, capacitors, transistors, resistors, rectifiers, converters, etc. in order to receive or transmit a signal to or from plural antenna (not shown). In particular, the communication circuitry communicates with the one or more processors, memory, transceiver, other electronic components, etc. of the electronic device to provide wireless communication via each antenna. The wireless card 300 also includes plural inputs 308 for receiving antenna. While three inputs 308 are illustrated, in other embodiments, only two inputs, or alternatively, at least eight inputs may be provided. In addition, while in the example embodiment of FIG. 3, all of the inputs 308 are presented on a single side of the wireless card 300, in other embodiments, the inputs 308 may be on more than one side, spaced around an entire perimeter, centrally located, or the like. In each instance, one or more processors may determine if a signal is being received or transmitted through each antenna, regardless of the amount of antenna or position of the antenna.

FIG. 4 illustrates a simplified block diagram of a control system 400 for an electronic device. In one example, the electronic device may be the electronic device as described in relation to FIG. 1. To this end, the components of the electronic device may be located only in a display, only in a main body, or may be located in both the display and main body.

The control system 400 includes components such as one or more processors 402 (e.g., a microprocessor, microcomputer, application-specific integrated circuit, etc.), one or more local storage medium (also referred to as a memory portion) 404, one or more wireless transceivers 406, a user interface 408 which includes one or more input devices 409 and one or more output devices 410, a power module 412, a component interface 414, a communication circuitry 416, a first antenna 418, a second antenna 420, third antenna 421, and a light indicator 422. All of these components can be operatively coupled to one another, and can be in communication with one another, by way of one or more internal communication links, such as an internal bus.

The local storage medium 404 can encompass one or more memory devices of any of a variety of forms (e.g., read only memory, random access memory, static random access memory, dynamic random access memory, etc.) and can be used by the processor 402 to store and retrieve data. The data that is stored by the local storage medium 404 can include, but not be limited to, operating systems, applications, etc. Each operating system includes executable code that controls basic functions of the device, such as interaction among the various components, communication with external devices via the wireless transceivers 406 and/or the component interface 414, and storage and retrieval of applications and context data to and from the local storage medium 406. In one embodiment, a communication application 424 may be provided.

The communication application 424 in one example provides executable code for the one or more processors 402 to monitor the first antenna 418, second antenna 420, and third antenna 421 to detect whether a first signal to or from the first antenna 418, a second signal to or from the second antenna 420, or a third signal to or from the third antenna 421 is present. If a first signal, a second signal, or a third signal is not detected, an indication that the corresponding first antenna 418, second antenna 420, or third antenna 421 is disconnected is provided. While three antenna are presented in this embodiment, in other embodiments, a fourth antenna, fifth antenna, etc. may similarly be monitored for a communication signal. The communication application 424 in response to no detection of a communication signal to or from either the first antenna or second antenna diagnosis an operating fault condition of a disconnected antenna, and determines remedial actions to correct, repair, fix, remedy the operating fault condition. Such remedial actions may include informing a user via a pop-up message that the first antenna or second antenna is disconnected. Such remedial actions can also include providing instructions to a user how to manually reconnect the antenna, including removing a cover from a main body or display. Alternatively, a remedial action may be providing a communication link or suggested location of a place to repair the electronic device. The communication link may include a manner through which a third party may be contacted for repairing the electronic device. Example communication links include a name and/or phone number of a repair location, an email address of a repair location, including a determined message already provided that includes information such as the electronic device make, model, serial number, or the like. The communication link in one example is a hyperlink to a website, contact page, or the like of one or more places to repair the electronic device. To this end, the one or more processors can use information such as location information from a global positioning system (GPS) in communication with the electronic device to locate the electronic device and the nearest repair locations. Such determinations may be made using a lookup table, decision tree, mathematical formula, mathematical model, an algorithm, etc.

Figure 5:
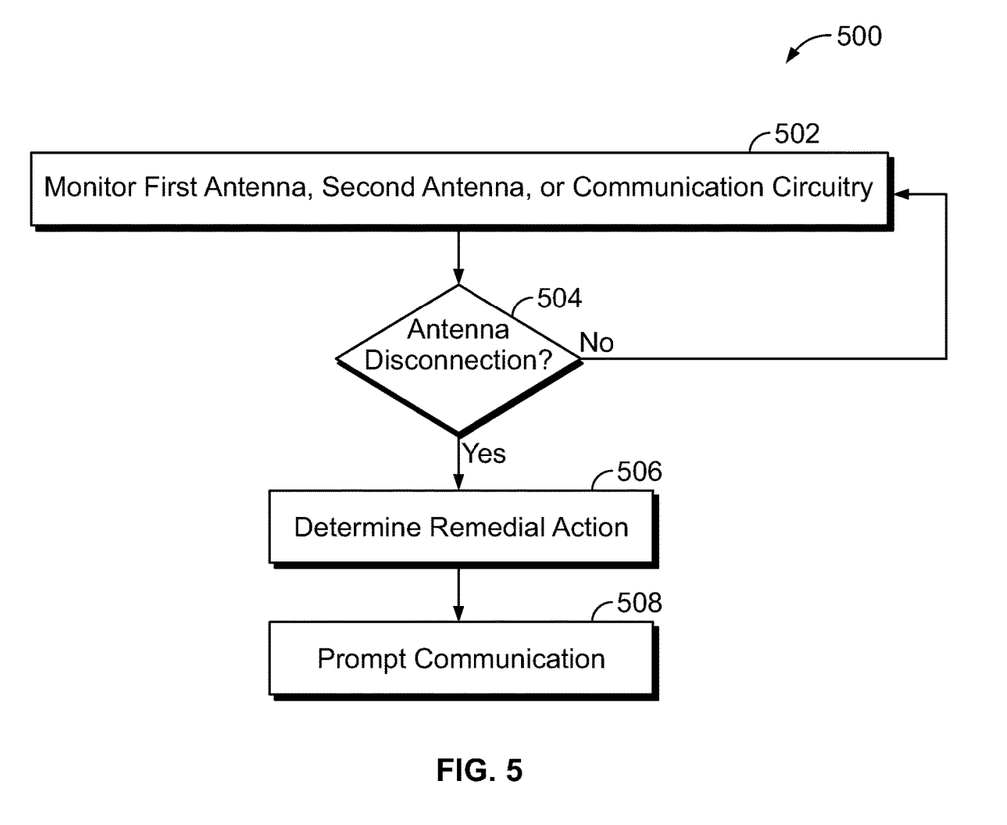
FIG. 5 illustrates a block flow diagram of a method of remedying a fault in accordance with an embodiment described herein.

FIG. 5 illustrates a block flow diagram of a method 500 for diagnosing and providing remedial action for a disconnected antenna. In one example, an electronic device of FIG. 1 is utilized to implement the method 500. In another example, the control system of FIG. 4 is used to execute instructions to provide the method 500. The electronic device may include a personal computer, laptop computer, tablet, phone, watch, smart device, iPad, iPod, or the like.

At 502, the one or more processors monitor a first antenna, second antenna, or communication circuitry to detect a first signal, or second signal. Specifically, the one or more processors monitor a first signal between a first antenna and communication circuitry of a substrate, such as a wireless card. In addition, the one or more processors monitor a second signal between a second antenna and communication circuitry of the substrate, such as the wireless card. Further, additional third, fourth, fifth, etc. signals between third, fourth, fifth antennas respectfully, and communication circuitry, or wireless card can be monitored. In one example, the one or more processors simultaneously monitor for multiple signals. In this manner, in one embodiment a first signal and a second signal are monitored, while in other embodiment, nine signals or more can be monitored. In particular, the antenna, or communication circuitry is monitored to detect the existence of the first signal and second signal. If a first signal and second signal are both detected, an indication is provided that a first antenna corresponding to the first signal and a second antenna corresponding to the second signal are mechanically coupled and not disconnected. In one example, a first signal corresponding to the first antenna can be detected while the second signal corresponding to the second antenna is not detected because of a disruption. In this instance, the disruption, or disconnect between the second antenna and a substrate containing the communication circuitry is presented. In another example, the second signal corresponding to the second antenna can be detected while the first signal corresponding to the first antenna is not detected, indicating a disruption, or disconnected first antenna from the substrate containing the communication circuitry.

In one embodiment, the one or more processors continuously monitor the antenna and/or communication circuitry. Alternatively, the one or more processors periodically monitor the antenna or communication circuitry, including once a day, or once a week, or once every two weeks, etc. In this manner, battery life and energy are conserved, even when monitoring the first signal and second signal. Alternatively, the one or more processors may monitor after a determined period, such as a week, but only monitor during use of the electronic device. In yet another example, the one or more processors may not monitor until actuated by a communication application. Specifically, when poor connectivity is provided, a communication application may be utilized by the user to attempt to diagnose why the connectivity to poor. Upon a request for a diagnostic check, the one or more processors may begin monitoring each antenna, or the communication circuitry. In this manner, the one or more processors only operate when a known problem with communication is presented.

At 504, the one or more processors diagnose or determine whether a first antenna disconnection or second antenna disconnection has occurred based on not detecting the first signal or the second signal. If at 504, a first signal and second signal are both detected, the one or more processors continue to monitor each antenna or the communication circuitry for the first signal and second signal.

If at 504, either a first signal is not detected, a second signal is not detected, or if neither the first signal and second signal are both not detected, then at 506, the one or more processors determine a remedial action in response to diagnosing the first antenna disconnection and/or the second antenna disconnection. Remedial actions include any suggestions, instructions, contact information, communication links, or the like that can be communicated to a user to facilitate repair of the disconnected antenna. Remedial actions can include instructions for repairing the first antenna disconnection or second antenna disconnection, contact information for repairing the first antenna disconnection or second antenna disconnection, etc.

The instructions may include written or text based instructions that pop up on the display of the electronic device, a text message that is communicated to an auxiliary electronic device related to the user such as a smart phone, tablet, smart watch, or the like, text instructions included in an electronic message (e.g. email) or attached to an email, voice commands from the electronic device or from an auxiliary electronic device that is in communication with the electronic device, or the like. The contact information for repairing the first antenna disconnection or second antenna disconnection includes a phone number, email address, fax number, website address, or the like.

The one or more processors may provide a communication link, including a hyperlink, placement of a phone number into a calling application, a prerecorded voice message, a prepared email, prepared text message, etc. The prerecorded voice message or prepared email may include the contact information of the user, electronic device make, model, serial number, etc., operating systems, application, warranty information, the specific antenna that is disconnected, date of detection, etc. In this manner, the user does not have to fill out any forms, collect information related to the electronic device that may be difficult to find, such as warranty information, and can immediately address the disconnection.

In addition, during the process of determining the remedial action, the one or more processor may determine several locations that are able to repair the electronic device. The one or more processor can also be configured to select the best option for repair, or rank the best options. The ranking may be determined based on distance from the electronic device, relation to electronic device such as company manufacturing or selling the electronic device, locations that will honor a warranty, costs, or the like. Such determination may be made utilizing a lookup table, decision tree, algorithm, artificial intelligence, mathematical model, mathematical function, or the like.

In all, the user does not have to guess why the connectivity of wireless communication has deteriorated or stopped working. Instead of having to check and reset a router, have a concern that the electronic device is in a dead zone or too far away from a router, have a concern that another electronic device is interfering with communication, concern that Wi-Fi or other wireless protocol is faulty, etc. the user immediately knows the wireless communication has faulty operation because of a disconnected antenna. Not only can the faulty wireless communication diagnosis be immediately made, but by providing the contact information, filling out forms, etc. fixing the problem is also facilitated, providing a superior experience for a user when needing a repair.

At 508, the one or more processors prompt a communication related to the first antenna or the second antenna in response to not detecting the first signal or second signal. The communication may be a pop-up, text message, email, etc. that is communicated to the user, or is communicated to a third party capable of repairing the electronic device. The communication may be text-based, sound-based, light-based, haptic-based, etc. The communication may be presented or displayed on a display so as to be readable by the user. Alternatively, a light indicator, such as an LED, emits light when a disconnected antenna is detected. In embodiments when a communication application is actuated by a user to perform a diagnostic on the wireless communication, the light indicator may effectively indicate a hardware problem, such as a disconnected antenna is provided.

In another example, a beep, or other sound may be emitted upon detecting the disconnected antenna. In yet another example, the communication may be in the form of a message to the user in a pop-up, email, text, or the like. The message may indicate a disconnected antenna has been detected and include the remedial action determined. For example, instructions on how to remove a panel and reconnect the antenna may be provided. Alternatively the message can include contact information for a vendor, manufacturer, repair shop, repair service, etc. that can reconnect the antenna to the wireless card.

In one embodiment, the one or more processors present at least one communication link within a communication to a user. The communication link may be a phone number, electronic mail, website address, hyperlink, or the like that is used to contact a third party. In yet another example a haptic response such as a vibrating or shaking of the electronic device is provided to alert the user of the disconnected antenna. In each instance, the prompt alerts the user of the disconnected antenna, and can also include remedial actions, including providing instructions of such remedial action to start the process of repairing, or reconnecting the antenna to the wireless card. By prompting the user, not only does the user immediately understand why wireless connectivity is faulty, but in addition, steps are undertaken to fix the disconnected antenna. As a result, a more pleasant overall user experience is provided.

As will be appreciated by one skilled in the art, various aspects may be embodied as a system, method, or computer (device) program product. Accordingly, aspects may take the form of an entirely hardware embodiment or an embodiment including hardware and software that may all generally be referred to herein as a "circuit," "module" or "system." Furthermore, aspects may take the form of a computer (device) program product embodied in one or more computer (device) readable storage medium(s) having computer (device) readable program code embodied thereon.

Any combination of one or more non-signal computer (device) readable medium(s) may be utilized. The non-signal medium may be a storage medium. A storage medium may be, for example, an electronic, magnetic, optical, electromagnetic, infrared, or semiconductor system, apparatus, or device, or any suitable combination of the foregoing. More specific examples of a storage medium would include the following: a portable computer diskette, a hard disk, a random access memory (RAM), a dynamic random access memory (DRAM), a read-only memory (ROM), an erasable programmable read-only memory (EPROM or Flash memory), a portable compact disc read-only memory (CD-ROM), an optical storage device, a magnetic storage device, or any suitable combination of the foregoing.

Program code embodied on a storage medium may be transmitted using any appropriate medium, including but not limited to, wireless, wireline, optical fiber cable, RF, et cetera, or any suitable combination of the foregoing.

Program code for carrying out operations may be written in any combination of one or more programming languages. The program code may execute entirely on a single device, partly on a single device, as a stand-alone software package, partly on single device and partly on another device, or entirely on the other device. In some cases, the devices may be connected through any type of network, including a local area network (LAN) or a wide area network (WAN), or the connection may be made through other devices (for example, through the Internet using an Internet Service Provider) or through a hard wire connection, such as over a USB connection. For example, a server having a first processor, a network interface, and a storage device for storing code may store the program code for carrying out the operations and provide this code through its network interface via a network to a second device having a second processor for execution of the code on the second device.

Aspects are described herein with reference to the figures, which illustrate example methods, devices, and program products according to various example embodiments. These program instructions may be provided to a processor of a general purpose computer, special purpose computer, or other programmable data processing device or information handling device to produce a machine, such that the instructions, which execute via a processor of the device implement the functions/acts specified.

The program instructions may also be stored in a device readable medium that can direct a device to function in a particular manner, such that the instructions stored in the device readable medium produce an article of manufacture including instructions which implement the function/act specified. The program instructions may also be loaded onto a device to cause a series of operational steps to be performed on the device to produce a device implemented process such that the instructions which execute on the device provide processes for implementing the functions/acts specified.

Although illustrative example embodiments have been described herein with reference to the accompanying figures, it is to be understood that this description is not limiting, and that various other changes and modifications may be affected therein by one skilled in the art without departing from the scope or spirit of the disclosure.

The modules/applications herein may include any processor-based or microprocessor-based system including systems using microcontrollers, reduced instruction set computers (RISC), application specific integrated circuits (ASICs), field-programmable gate arrays (FPGAs), logic circuits, and any other circuit or processor capable of executing the functions described herein. Additionally or alternatively, the modules/controllers herein may represent circuit modules that may be implemented as hardware with associated instructions (for example, software stored on a tangible and non-transitory computer readable storage medium, such as a computer hard drive, ROM, RAM, or the like) that perform the operations described herein. The above examples are exemplary only, and are thus not intended to limit in any way the definition and/or meaning of the term "controller." The modules/applications herein may execute a set of instructions that are stored in one or more storage elements, in order to process data. The storage elements may also store data or other information as desired or needed. The storage element may be in the form of an information source or a physical memory element within the modules/controllers herein. The set of instructions may include various commands that instruct the modules/applications herein to perform specific operations such as the methods and processes of the various embodiments of the subject matter described herein. The set of instructions may be in the form of a software program. The software may be in various forms such as system software or application software. Further, the software may be in the form of a collection of separate programs or modules, a program module within a larger program or a portion of a program module. The software also may include modular programming in the form of object-oriented programming. The processing of input data by the processing machine may be in response to user commands, or in response to results of previous processing, or in response to a request made by another processing machine.

It is to be understood that the above description is intended to be illustrative, and not restrictive. For example, the above-described embodiments (and/or aspects thereof) may be used in combination with each other. In addition, many modifications may be made to adapt a particular situation or material to the teachings herein without departing from its scope. While the dimensions, types of materials and coatings described herein are intended to define various parameters, they are by no means limiting and are illustrative in nature. Many other embodiments will be apparent to those of skill in the art upon reviewing the above description. The scope of the embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects or order of execution on their acts.

What is claimed is:

1. An electronic device comprising:
   a substrate for receiving communication circuitry;
   an antenna coupled to the substrate and configured to provide a first signal to the communication circuitry;
   one or more processors;
   a data storage device having executable instructions accessible by the one or more processors;
   wherein, responsive to execution of the instructions, the one or more processors are configured to:
   monitor the antenna or the communication circuitry to detect the first signal;
   receive a second signal at the communication circuitry; and
   prompt a communication related to the antenna in response to not detecting the first signal when receiving the second signal or detecting a first degraded signal compared to the second signal;
   wherein the first signal is the first degraded signal when the first signal has a strength that is less than a threshold percentage of the second signal; and
   wherein the threshold percentage varies based on the location of the electronic device or duration of time of monitoring the first signal.

2. The electronic device of claim 1, wherein the one or more processors are further configured to:
  diagnose an antenna disconnection based on not detecting the first signal or detecting the first degraded signal.

3. The electronic device of claim 1, wherein the one or more processors are further configured to:
  diagnose the first degraded signal by comparing the first signal to the second signal.

4. The electronic device of claim 1, wherein the one or more processors are further configured to:
  determine a remedial action in response to diagnosing an antenna disconnection or the first degraded signal; and
  include the remedial action in the communication related to the antenna disconnection or the first degraded signal.

5. The electronic device of claim 4, wherein the remedial action is one of instructions for repairing the antenna disconnection or the first degraded signal, or contact information for repairing the antenna disconnection or the first degraded signal.

6. The electronic device of claim 1, wherein the substrate is a wireless card.

7. The electronic device of claim 1, further comprising a display coupled to the one or more processors, wherein the one or more processors are also configured to display the communication related to the antenna disconnection or first degraded signal.

8. The electronic device of claim 1, further comprising an indicator light coupled to the one or more processors, and wherein to prompt the communication related to the antenna disconnection or the first degraded signal the one or more processors are configured to actuate the indicator light.

9. An electronic device comprising:
  a first wireless card for receiving communication circuitry;
  a first antenna coupled to the first wireless card and configured to provide a first signal to the first wireless card;
  a second antenna coupled to the first wireless card and configured to provide a second signal to the first wireless card;
  one or more processors;
  a data storage device having executable instructions accessible by the one or more processors;
  wherein, responsive to execution of the instructions, the one or more processors are configured to:
    monitor the first antenna, and second antenna to detect the first signal, and second signal;
    diagnose a first antenna disconnection from the first wireless card, or a first antenna degraded signal; and
    diagnose a second antenna disconnection from the first wireless card, or second antenna degraded signal.

10. The electronic device of claim 9, wherein to diagnose the first antenna disconnection from the first wireless card, or the first antenna degraded signal, the first signal is compared to the second signal.

11. The electronic device of claim 9, wherein the one or more processors are further configured to:
  determine a remedial action in response to diagnosing the first antenna disconnection, or first antenna degraded signal; and
  communicate the remedial action to a user of the electronic device.

12. The electronic device of claim 9, wherein to communicate the remedial action to a user of the electronic device includes displaying the remedial action on a display.

13. A computer implemented method, comprising:
  under control of one or more processors including program instructions to:
  monitor a first signal communicated between a first antenna and a wireless card;
  monitor a second signal communicated between a second antenna and the wireless card;
  diagnose a first antenna disconnection or a first antenna degraded signal based on a comparison of the first signal to the second signal; and
  prompt a communication related to the first antenna disconnection or the first antenna degraded signal.

14. The computer implemented method of claim 13, further comprising:
  under control of the one or more processors including program instructions to:
  determine a remedial action in response to diagnosing the first antenna disconnection or the first antenna degraded signal.

15. The computer implemented method of claim 14, further comprising:
  under control of one or more processors including program instructions to:
  implement the remedial action in response to determining the remedial action.

16. The computer implemented method of claim 14,
  under control of one or more processors including program instructions to:
  include the remedial action in the communication related to the first antenna or the second antenna.

17. The computer implemented method of claim 14, wherein the remedial action is one of instructions for repairing the first antenna disconnection or first antenna degraded signal, or contact information for repairing the first antenna disconnection or first antenna degraded signal.

18. The computer implemented method of claim 13, wherein to diagnose the first antenna degraded signal a first antenna signal strength is compared to a second antenna signal strength and a strength threshold is exceeded.

* * * * *